(12) United States Patent
Deshpande

(10) Patent No.: US 6,846,612 B2
(45) Date of Patent: Jan. 25, 2005

(54) ORGANIC ANTI-REFLECTIVE COATING COMPOSITIONS FOR ADVANCED MICROLITHOGRAPHY

(75) Inventor: Shreeram V. Deshpande, Rolla, MO (US)

(73) Assignee: Brewer Science Inc., Rolla, MO (US)

(*) Notice: Subject to any disclaimer, the term of this patent is extended or adjusted under 35 U.S.C. 154(b) by 18 days.

(21) Appl. No.: 10/062,790

(22) Filed: Feb. 1, 2002

(65) Prior Publication Data

US 2003/0162125 A1 Aug. 28, 2003

(51) Int. Cl.⁷ ............... G03C 1/492; C08L 63/00
(52) U.S. Cl. ............... 430/271.1; 430/325; 430/905; 525/523
(58) Field of Search ............... 430/271.1, 905, 430/325, 270.1, 286.1, 280.1; 525/523; 403/280.1; 526/238.23, 270, 273, 262, 326

(56) References Cited

U.S. PATENT DOCUMENTS

| | | | | |
|---|---|---|---|---|
| 3,635,889 A | * | 1/1972 | Bowen | 260/47 |
| 6,110,653 A | * | 8/2000 | Holmes et al. | 430/325 |
| 6,132,935 A | * | 10/2000 | Kobayashi et al. | 430/281.1 |
| 6,495,305 B1 | * | 12/2002 | Enomoto et al. | 430/270.1 |

| | | | | |
|---|---|---|---|---|
| 2003/0004283 A1 | * | 1/2003 | Puligadda et al. | |

FOREIGN PATENT DOCUMENTS

| | | | |
|---|---|---|---|
| DE | 1931452 | * | 1/1970 |
| DE | 19520625 | * | 12/1995 |
| JP | 11-102071 | * | 4/1999 |
| JP | 2001-147538 | * | 5/2001 |

OTHER PUBLICATIONS

Nakano, T., et a., "Positive–Type Photopolyimide Based on Vinyl Ether Crosslinking and De–Crosslinking," *J. Photopolym. Sci. Technol.*, vol. 13, No. 5, 2000.

Noppakundilograt, S., et al., "Visible Light–Sensitive Positive–Working Photopolymer Based on Poly(p–hydroxystyrene) and Vinyl Ether Crosslinker," *J. Photopolym. Sci. Technol.*, vol. 13, No. 5, 2000.

* cited by examiner

*Primary Examiner*—Rosemary Ashton
(74) *Attorney, Agent, or Firm*—Hovey Williams LLP

(57) ABSTRACT

New polymers and new anti-reflective compositions containing such polymers are provided. The compositions comprise a polymer (e.g., epoxy cresol novolac resins) bonded with a chromophore (4-hydroxybenzoic acid, trimellitic anhydride). The inventive compositions can be applied to substrates (e.g., silicon wafers) to form anti-reflective coating layers having high etch rates which minimize or prevent reflection during subsequent photoresist exposure and developing.

32 Claims, 4 Drawing Sheets

ORGANIC ANTI-REFLECTIVE COATING COMPOSITIONS FOR ADVANCED MICROLITHOGRAPHY

BACKGROUND OF THE INVENTION

1. Field of the Invention

The present invention is concerned with new polymers, new anti-reflective compositions containing such polymers and methods of using these new anti-reflective compositions to manufacture microelectronic devices. These compositions include a polymer formed from a starting polymer (e.g., epoxy cresol novolac resins) grafted with a chromophore (e.g., trimellitic anhydride, 4-hydroxybenzoic acid).

2. Description of the Prior Art

Integrated circuit manufacturers are consistently seeking to maximize substrate wafer sizes and minimize device feature dimensions in order to improve yield, reduce unit case, and increase on-chip computing power. Device feature sizes on silicon or other chips are now submicron in size with the advent of advanced deep ultraviolet (DUV) microlithographic processes.

However, a frequent problem encountered by photoresists during the manufacturing of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is non-planar and/or highly reflective. One approach to address this problem is the use or an anti-reflective coating applied to the substrate beneath the photoresist layer.

Compositions which have high optical density at the typical exposure wavelengths have been used for some time to form these anti-reflective layers. The anti-reflective coating compositions typically consist of an organic polymer which provides coating properties and a dye for absorbing light. The dye is either blended into the composition or chemically bonded to the polymer. Thermosetting anti-reflective coatings contain a crosslinking agent in addition to the polymer and dye. Crosslinking is initiated thermally, and this is typically accomplished by an acid catalyst present in the composition.

Typical crosslinking agents include melamines and benzoguanamines. These types of crosslinkers typically impart basicity to the anti-reflective coating formulation, thus resulting in footing of the photoresist profile. This footing profile is not desirable as it can be transferred to the substrate in pattern transfer plasma etch processes. This can lead to device failures. Furthermore, the use of these types of crosslinking agents can affect how the composition planarizes over topography. Most traditional crosslinking agents result in shrinkage of the anti-reflective coating film upon baking, resulting in voids within the via holes, insufficient coverage on top of the via holes, and/or large thickness variations between isolated and dense vias. There is a need for an anti-reflective coating composition that avoids these problems.

SUMMARY OF THE INVENTION

The present invention overcomes the problems of the prior art by broadly providing new polymers and anti-reflective coating compositions containing these new polymers.

In more detail, the inventive polymers comprise recurring monomers having the formula

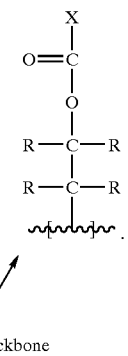

polymer backbone

In this formula, it is preferred that each R is individually selected from the group consisting of —OH, —H, and substituted and unsubstituted alkyl groups (preferably $C_1$–$C_8$, and more preferably $C_1$–$C_4$). X preferably includes an aromatic and/or heterocyclic light-absorbing moiety such as those selected from the group consisting of thiophenes, naphthoic acid, anthracene, naphthalene, benzene, chalcone, phthalimides, pamoic acid, acridine, azo compounds, dibenzofuran, and derivatives thereof. The term "derivatives thereof" as used herein is intended to include substituted forms of the foregoing so long as those substituted forms are aromatic or heterocylic. For example, the structure

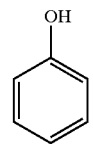

would be considered a derivative of benzene. Particularly preferred X groups include those selected from the group consisting of

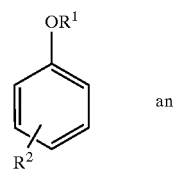 and 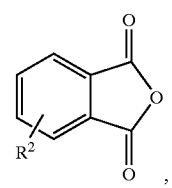

where $R^1$ is selected from the group consisting of —H and alkyl groups (preferably $C_1$–$C_8$, and more preferably $C_1$–$C_4$), and each $R^2$ is individually an electron withdrawing group or an electron donating group. Preferred such groups include —H, alkyl groups (preferably $C_1$–$C_8$, and more preferably $C_1$–$C_4$), amino groups, nitro groups, —$SO_3H$, —$SO_4$, —COOH, ester groups, aldehyde groups, and ketone groups.

In embodiments where none of the R groups is —OH and none of the R groups includes an —OH group as part of its structure, then it is preferred that X includes an —OH group (and particularly a crosslinkable —OH group) in its structure. Furthermore, preferred polymers include from about 10–60% by weight of X, more preferably from about 20–60% by weight of X, and even more preferably from about 20–40% by weight of X, based upon the total weight of the polymer taken as 100% by weight. When used in anti-reflective coating compositions, it is preferred that the average molecular weight of the polymer be from about 3,000–60,000 Daltons, more preferably from about 3,000–15,000 Daltons, and most preferably from about 3,000–5,000 Daltons. Finally, while 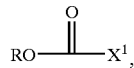 can include any polymer, preferred polymers are those selected from the group consisting of acrylics, polyesters, epoxy novolacs, polysaccharides, polyethers, polyimides, polyurethanes, and mixtures thereof.

The inventive polymers are formed by reacting a starting polymer with a chromophore, preferably in the presence of a catalyst. This reaction is preferably carried out in a solvent system and at temperatures of from about 100–200° C. for a time period of from about 2–24 hours. The starting polymer should be present at a level of from about 5–50% by weight, and more preferably from about 5–20% by weight, based upon the total weight of the reaction mixture taken as 100% by weight. Preferred starting polymers include any polymers which have an epoxide ring in the repeating unit thereof. This includes epoxy cresol novolacs as well as phenol novolacs, acrylics, polyesters, polysaccharaides, polyethers, and polyimides having the epoxide ring in the repeat unit. In any case, it is preferred that the epoxide group account for about 20–80% by weight, and preferably about 20–40% by weight of the total polymer, depending upon the absorptivity of the chromophores to be grafted onto the polymer.

The molar ratio of starting polymer to chromophore should be from about 1:0.5 to about 1:1, and more preferably about 1:1. Preferred chromophores include any aromatic light-absorbing compound which can covalently bond to the starting polymer, and will generally have the formula $$\text{RO}-\overset{\overset{\displaystyle O}{\|}}{\text{C}}-X^1,$$

where R is selected from the group consisting of —H and substituted and unsubstituted alkyl groups (preferably $C_1$–$C_8$, and more preferably $C_1$–$C_4$) and $X^1$ is an aromatic or heterocyclic light-absorbing moiety. This includes chromophores having phenolic —OH, —COOH, and —$NH_2$ functional groups. Some chromophores which are suitable include thiophenes, naphthoic acid, anthracene, naphthalene, benzene, chalcone, phthalimides, pamoic acid, acridine, azo compounds, dibenzofuran, and derivatives thereof. Particularly preferred such compounds are 4-hydroxybenzoic acid and trimellitic anhydride.

The catalyst is preferably present in amounts of from about 0.1–5% by weight, and more preferably from about 0.5–4% by weight, based upon the total weight of the starting polymer taken as 100% by weight. Preferred catalysts include Bisphenol S, p-toluenesulfonic acid, benzyl triethyl ammonium chloride (BTEAC), phosphonium salts, and other quaternary salts. The solvent system used in preparing the polymer should be present in the reaction mixture at a level of from about 50–95% by weight, and more preferably from about 80–95% by weight, based upon the total weight of the reaction mixture taken as 100% by weight. Preferred solvents include ethyl lactate and propylene glycol monomethyl ether acetate (PGMEA). Reacting the starting polymer with a chromophore as described will result in a new polymer having the structure set forth in Formula I above.

It will be appreciated that the polymers of the invention can be utilized to make compositions (e.g., anti-reflective coatings) for use in microlithographic processes. The compositions are formed by simply dispersing or dissolving the polymer(s) in a suitable solvent system, preferably at ambient conditions and for a sufficient amount of time to form a substantially homogeneous dispersion. Preferred compositions comprise from about 1–10% by weight of the polymer based on the total weight of the composition taken as 100% by weight.

The solvent systems can include any solvent suitable for use in the microelectronic manufacturing environment. Preferred solvent systems include a solvent selected from the group consisting of propylene glycol monomethyl ether (PGME), PGMEA, ethyl lactate, cyclohexanone, n-methyl pyrrolidone, propylene glycol n-propyl ether, and mixtures thereof. Preferably, the solvent system has a boiling point of from about 80–200° C. Any additional ingredients are also preferably dispersed in the solvent system along with the polymer.

It will be appreciated that this invention provides a distinct advantage in that the use of an additional crosslinking agent is not necessary. That is, the polymer provides the necessary crosslinking in and of itself. Thus, in this embodiment, the anti-reflective coating compositions are essentially free (i.e., less than about 0.01% by weight) of any added crosslinking agents.

In an alternate embodiment, the anti-reflective coating compositions can comprise a separately added crosslinking agent. Preferred crosslinking agents include aminoplasts (e.g., POWDERLINK® 1174, Cymel® products), epoxies, polyols, anhydrides, glycidyl ethers, vinyl ethers, and mixtures thereof. The most preferred crosslinking agents are those selected from the group consisting of glycourils, melamines, trimethylolpropane trivinylether, and trimethylolpropane triglycidylether.

The crosslinking agent should be present in the composition at a level of from about 2–15% by weight, and preferably from about 2–10% by weight, based upon the total weight of the composition taken as 100% by weight. Thus, the compositions of the invention should crosslink at a temperature of from about 80–250° C., and more preferably from about 115–205° C.

It will be appreciated that a number of other optional ingredients can be included in the composition as well. Typical optional ingredients include surfactants, adhesion promoters, and low molecular weight polymers.

The method of applying the inventive anti-reflective compositions to a substrate (e.g., Si, Al, W, WSi, GaAs, SiGe, Ta, and TaN wafers) simply comprises applying a quantity of a composition hereof to the substrate surface (either a planar surface or one comprising vias or holes formed therein) by any conventional application method, including spin-coating. The layer should then be heated to at least about the crosslinking temperature of the composition (e.g., 115–205° C.) so as to cure the layer having a thickness of anywhere from about 200–10,000 Å where the thickness is defined as the average of 5 measurements taken by an ellipsometer. A photoresist can then be applied to the cured material, followed by exposing, developing, and etching the photoresist. It will be understood that any 193 nm photoresist can be used with the present invention.

Anti-reflective coatings according to the invention have high etch rates. Thus, the cured anti-reflective coatings have an etch selectivity to resist (i.e., the anti-reflective coating layer etch rate divided by the photoresist etch rate) of at least about 1.0, and preferably at least about 1.2, when $HBr/O_2$ (60/40) is used as the etchant and a DUV photoresist is used. Additionally, at 193 nm the inventive anti-reflective coating layers have a k value (i.e., the imaginary component of the complex index of refraction) of at least about 0.20, and preferably at least about 0.25. That is, a cured layer formed from the inventive composition and having a thickness of about 300 Å will absorb at least about 95%, and preferably at least about 98% of light at a wavelength of about 193 nm. Furthermore, the inventive anti-reflective coatings will be substantially insoluble in typical photoresist solvents (e.g., ethyl lactate). When subjected to a stripping test as hereinafter defined, the inventive anti-reflective coating layers will have a percent stripping of less than about 5%, and preferably less than about 1%. When subjected to the interlayer test as hereinafter defined, the anti-reflective coatings will yield a result of less than about 5%, and preferably less than about 1%. Finally, the coatings can be used to obtain a resolution of about 0.1 μm in 193 nm photoresist.

DETAILED DESCRIPTION OF THE PREFERRED EMBODIMENTS

EXAMPLES

Figure 1:
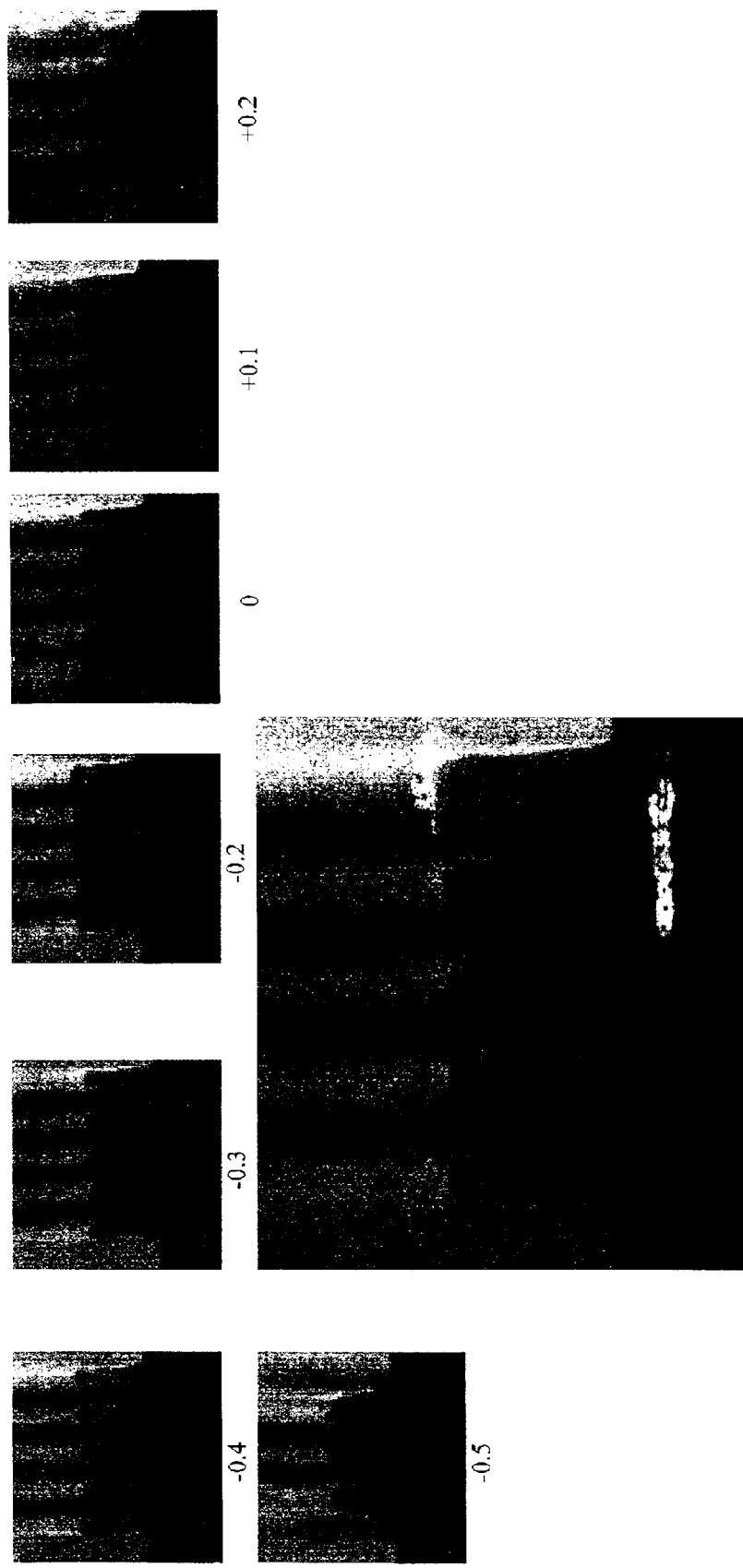
FIG. 1 depicts scanning electron microscope (SEM) photographs showing cross-sectional views of respective silicon wafers coated with an anti-reflective coating composition as described in Part 1 of Example 1.

The following examples set forth preferred methods in accordance with the invention. It is to be understood, however, that these examples are provided by way of illustration and nothing therein should be taken as a limitation upon the overall scope of the invention.

Example 1

1. Anti-reflective Coating without Crosslinking Agent

An epoxy cresol novolac resin (ECN 1299, available from Dow Chemical Company) was dissolved in a 75:25 solvent solution of ethyl lactate:PGMEA to obtain reaction mixture having a solids content of approximately 20% by weight. Equimolar amounts of trimellitic anhydride (obtained from Aldrich Chemical Company) were added to the reaction mixture. Benzyl triethyl ammonium chloride (BTEAC) was added to the mixture (2% by weight, based upon the weight of epoxy cresol novolac resin), and the reaction mixture was heated to 120° C. in an oil bath under a nitrogen atmosphere for two hours. The reaction mixture was then cooled and formulated into an anti-reflective coating (at a solids content of approximately 5% by weight) by the addition of p-toluenesulfonic acid (p-TSA) as the catalyst for crosslinking at a temperature of 205° C. Tables 1 and 2 set forth the respective formulations of the mother liquor and anti-reflective coating compositions.

TABLE 1

Mother Liquor[a]

| INGREDIENT | AMOUNT |
|---|---|
| Epoxy cresol novolac resin | 10 g (0.056 mols) |
| Trimellitic anhydride | 10.76 g (0.056 mols) |
| Ethyl lactate:PGMEA mixture[b] | 100 g |

[a]2% by weight of polymer
[b]75:25

TABLE 2

Anti-reflective Composition

| INGREDIENT | AMOUNT |
|---|---|
| Mother Liquor[a] | 60 g |
| p-TSA | 0.5 g |
| Ethyl lactate:PGMEA mixture[b] | 159.5 g |

[a]containing about 10.63 g of polymer solids
[b]75:25 - to obtain 5% by weight solids I. Evaluation of Properties Scheme A sets forth the reaction taking place during formulation of the polymer.

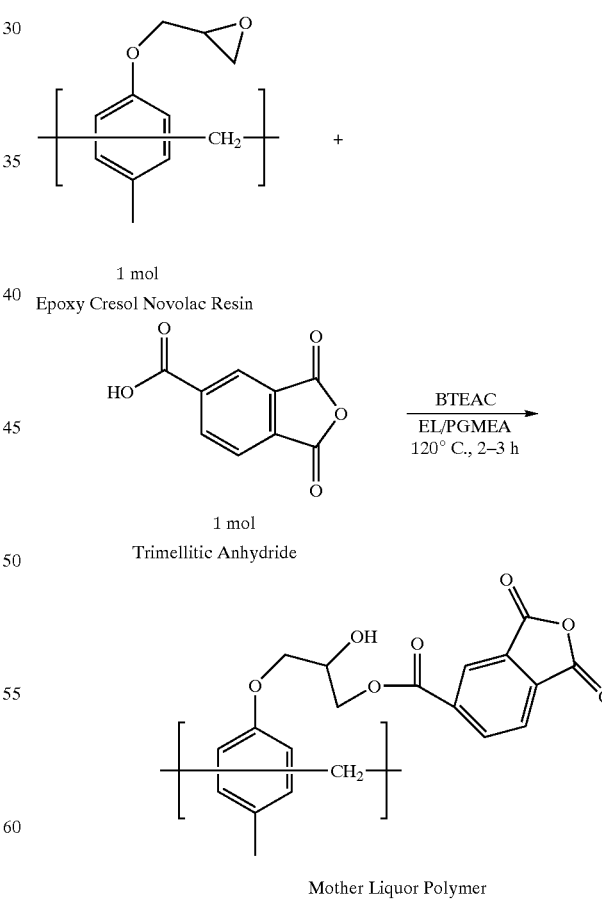

Scheme A 1 mol
Epoxy Cresol Novolac Resin

BTEAC
EL/PGMEA
120° C., 2–3 h 1 mol
Trimellitic Anhydride

Mother Liquor Polymer

The anti-reflective coating composition was evaluated for its properties. First, the composition was spin-coated at 2500 rpm for 60 seconds to remove solvents, followed by baking at 205° C. for 60 seconds to form a thermoset polymer film. The film thickness was measured using a Woolam ellipsometer.

a. Stripping Test

In order to confirm that the crosslinked film was substantially insoluble in typical photoresist solvents, the composition was subjected to a stripping test. In this test, the composition was spin-coated and baked on a silicon wafer as described above. The film thickness was then measured at 5 points using ellipsometry to determine the initial average film thickness, and the film was exposed to a puddle of ethyl lactate or PGMEA for 30 seconds. After 30 seconds, the wafer was spun at 2500–5000 rpm to dry the film, and then baked at 120° C. to remove any residual solvent. The thickness of the film was measured again at 5 points to determine the final average film thickness. The amount of stripping is the difference between the initial and final average film thicknesses. The percent stripping is:

$$\% \text{ stripping} = \left(\frac{\text{amount of stripping}}{\text{initial average film thickness}}\right) \times 100$$

b. Interlayer Test

This test was carried out to evaluate the interactions between the anti-reflective coating composition layer and a photoresist layer. A silicon wafer was coated with the inventive composition as described above. The initial average film thickness was determined as described with respect to the stripping test, and then a 193 nm, chemically-amplified photoresist (① ARCH GARS7102, ARCH Chemicals; a cyclic olefin maleic anhydride-based photoresist was used for the compositions shown in Tables 2–4 and 6; ② Sumitomo's AX4838A-25 series of photoresists was used for the composition shown in Table 7) was coated on top of the film by spin-coating the photoresist at 1500–2500 rpm for 60 seconds followed by baking at 130° C. for 60 seconds. The photoresist was exposed to 193 nm of light for 3–10 seconds followed by a post-exposure bake at 130° C. for 60 seconds. The photoresist was then developed using a commercially available developer (① MF 319, available from Shipley was used for the ARCH photoresist; ② PD523AD, available from Moses Lake Industries was used for the Sumitomo photoresist) followed by rinsing with deionized water. The final average film thickness was determined as described in the stripping test. The amount of intermixing between the anti-reflective coating layer and the photoresist layer is the difference between the initial and final average film thicknesses. The percent intermixing is:

$$\% \text{ interlayer mixing} = \left(\frac{\text{amount of intermixing}}{\text{initial average film thickness}}\right) \times 100$$

c. Via Fill Performance

The compositions were evaluated for their via fill properties by applying them to small pieces (chips) of via wafers. The vias were 0.20 μm in diameter and had individual depths of 7000–10,000 Å. The composition was spin-coated onto the chips at 400 rpm for 20 seconds, 800 rpm for 20 seconds, and 2000 rpm for 20 seconds. The chips were baked at 205° C. for 60 seconds, and then cross-sectioned and photographed with a scanning electron microscope.

II. RESULTS

When subjected to the foregoing tests, the composition of this Part 1 of this example gave a stripping test result of 15 Å and an interlayer result of 18 Å. Furthermore, when the formulation was evaluated for its lithographic compatibility with 193 nm photoresists and using a 193 nm exposure tool to pattern the resist, the formulation showed excellent compatibility with the resist. It did not exhibit any footing or undercutting on the photoresist profile, and the photoresist did not show any reflective notching or standing wave, thus suggesting good reflectivity control by the composition. The SEM photographs from this sample are shown in FIG. 1 [(1) PAR710; SB: 130° C./60 sec; PEB: 130° C./60 sec; Thickness: 3300 Å; ASML PAS 5500/950 scanner; Annular illumination; Mask TM99LF; Development OPD5262/60 sec; Exposure 8.3 ml; and (2) Anti-Reflective Coating—Thickness: 1051 Å; 200SS rpm; and Bake: 205° C./60 sec].

2. Anti-reflective Coating with POWDERLINK® Crosslinking Agent

The procedure described in Part 1 of this example was repeated as described above except that a crosslinking agent (POWDERLINK® 1174) was added, and the quantities of the ingredients of the anti-reflective coating composition was as shown in Table 3.

TABLE 3

Anti-reflective Composition

| INGREDIENT | AMOUNT |
|---|---|
| Mother Liquor[a] | 60 g |
| p-TSA | 0.106 g |
| Ethyl lactate:PGMEA mixture[b] | 195 g |
| POWDERLINK ® 1174[c] | 2.12 g |

[a]containing about 10.63 g of polymer solids
[b]75:25 - to obtain 5% by weight solids
[c]20% by weight of mother liquor solids; obtained from Cytec Industries This composition was applied to a wafer as described in Part 1 of this example, forming a cured film with a nominal thickness of 1070 Å. The stripping test result was 0 Å while the interlayer test result was 5 Å.

3. Anti-reflective Coating with Crosslinking Agent

The procedure described in Part 1 of this example was repeated as described above except that a crosslinking agent (trimethylolpropane triglycidylether) was added, and the quantities of the ingredients of the anti-reflective coating composition was as shown in Table 4.

TABLE 4

Anti-reflective Composition

| INGREDIENT | AMOUNT |
|---|---|
| Mother Liquor[a] | 60 g |
| p-TSA | 0.106 g |
| Ethyl lactate:PGMEA mixture[b] | 195 g |
| Trimethylolpropane triglycidylether[c] | 2.12 g |

[a]containing about 10.63 g of polymer solids
[b]75:25 - to obtain 5% by weight solids
[c]20% by weight of mother liquor solids This composition was applied to a wafer as described in Part 1 of this example, forming a cured film with a nominal thickness of 1060 Å. The stripping test result was 10 Å while the interlayer test result was 20 Å.

Example 2

1. Anti-reflective Coating with a Trivinylether Crosslinking Agent

An epoxy cresol novolac resin (ECN 1299) was dissolved in a 75:25 solvent solution of ethyl lactate:PGMEA to obtain a reaction mixture having a solids content of approximately 20% by weight. Equimolar amounts of 4-hydroxybenzoic acid were added to the reaction mixture. BTEAC was added to the mixture (2% by weight, based upon the weight of epoxy cresol novolac resin), and the reaction mixture was heated to 120° C. in an oil bath under a nitrogen atmosphere for twenty-four hours. The reaction mixture was cooled and formulated into an anti-reflective coating (at a solids content of approximately 5% by weight) by the addition of trimethylolpropane trivinylether (crosslinking agent, obtained from Aldrich Chemical Company) and p-TSA as the catalyst for crosslinking at a temperature of 205° C. Tables 5 and 6 set forth the respective formulations of the mother liquor and anti-reflective coating compositions.

TABLE 5

Mother Liquor[a]

| INGREDIENT | AMOUNT |
|---|---|
| Epoxy cresol novolac resin | 10 g (0.056 mols) |
| 4-hydroxybenzoic acid | 7.73 g (0.056 mols) |
| Ethyl lactate:PGMEA mixture[b] | 100 g |

[a]2% by weight of polymer
[b]75:25

TABLE 6

Anti-reflective Composition

| INGREDIENT | AMOUNT |
|---|---|
| Mother Liquor | 47 g |
| Trimethylolpropane trivinylether | 4.5 g |
| p-TSA | 0.45 g |
| Ethyl lactate:PGMEA mixture[a] | 233 g |

[a]75:25 - to obtain 5% by weight solids

Scheme B sets forth the reaction taking place during formulation of the polymer.

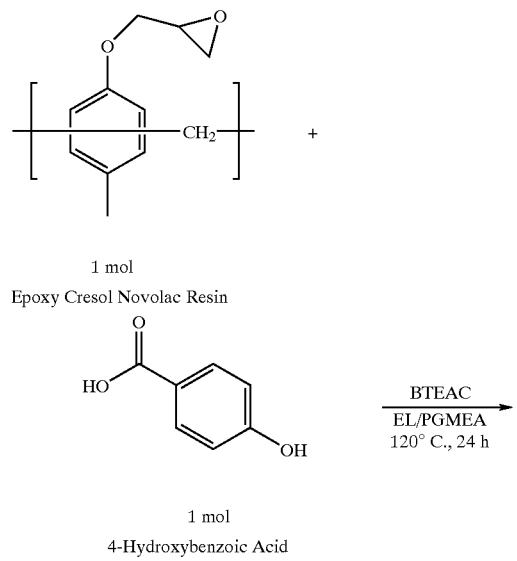

Scheme B 1 mol
Epoxy Cresol Novolac Resin 1 mol
4-Hydroxybenzoic Acid

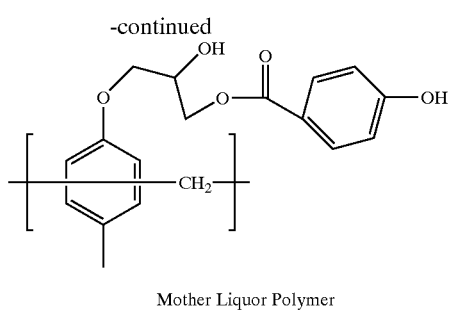

Mother Liquor Polymer

The properties of the inventive composition as well as the films formed by the composition were analyzed as described above with respect to Example 1. The nominal film thickness of the composition was 570 Å, while the stripping test result was 2.5 Å. The interlayer test yielded a result of 13 Å.

2. Anti-reflective Coating with POWDERLINK® Crosslinking Agent

The procedure described in Part 1 of this example was repeated as described above except that a crosslinking agent was added, and the quantities of the ingredients of the anti-reflective coating composition was as shown in Table 7.

TABLE 7

Anti-reflective Composition

| INGREDIENT | AMOUNT |
|---|---|
| Mother Liquor | 60 g |
| p-TSA | 0.21 g |
| Bisphenol S | 0.37 g |
| PGME:PGMEA mixture[a] | 802 g |
| POWDERLINK ® 1174 | 3.0 g |

[a]20:80 - to obtain approximately 1.85% by weight solids

Figure 2:
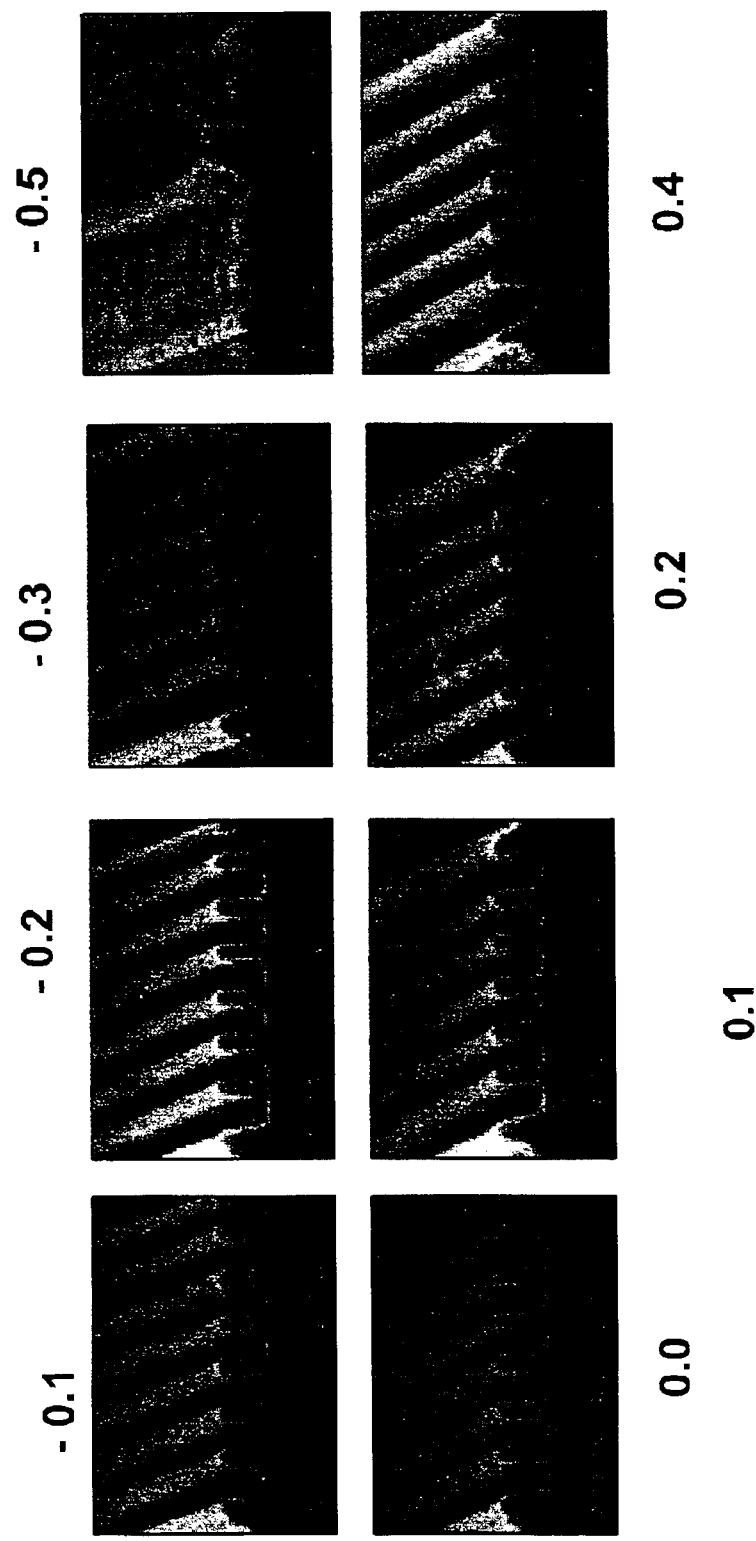
FIG. 2 shows SEM photographs depicting cross-sectional views of respective silicon wafers coated with an anti-reflective coating composition as described in Part 2 of Example 2 where a commercially available photoresist was used.
Figure 3:
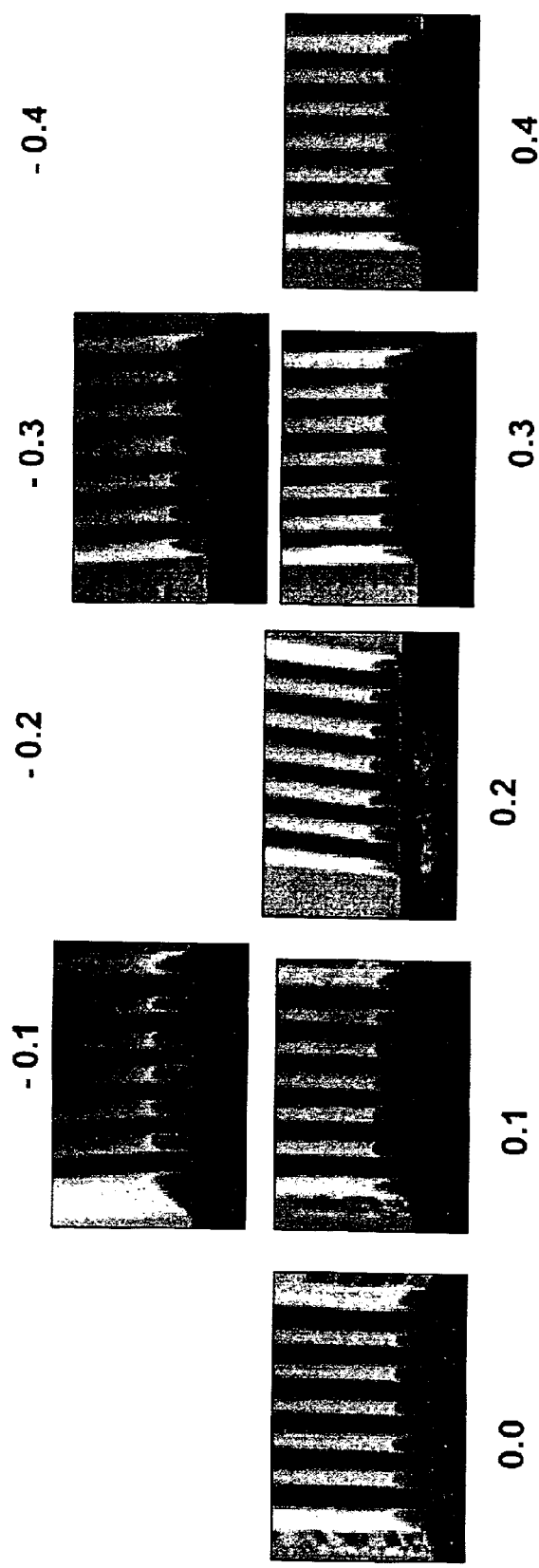
FIG. 3 shows SEM photographs similar to those of FIG. 2 except that a different commercially available photoresist was used.
Figure 4:
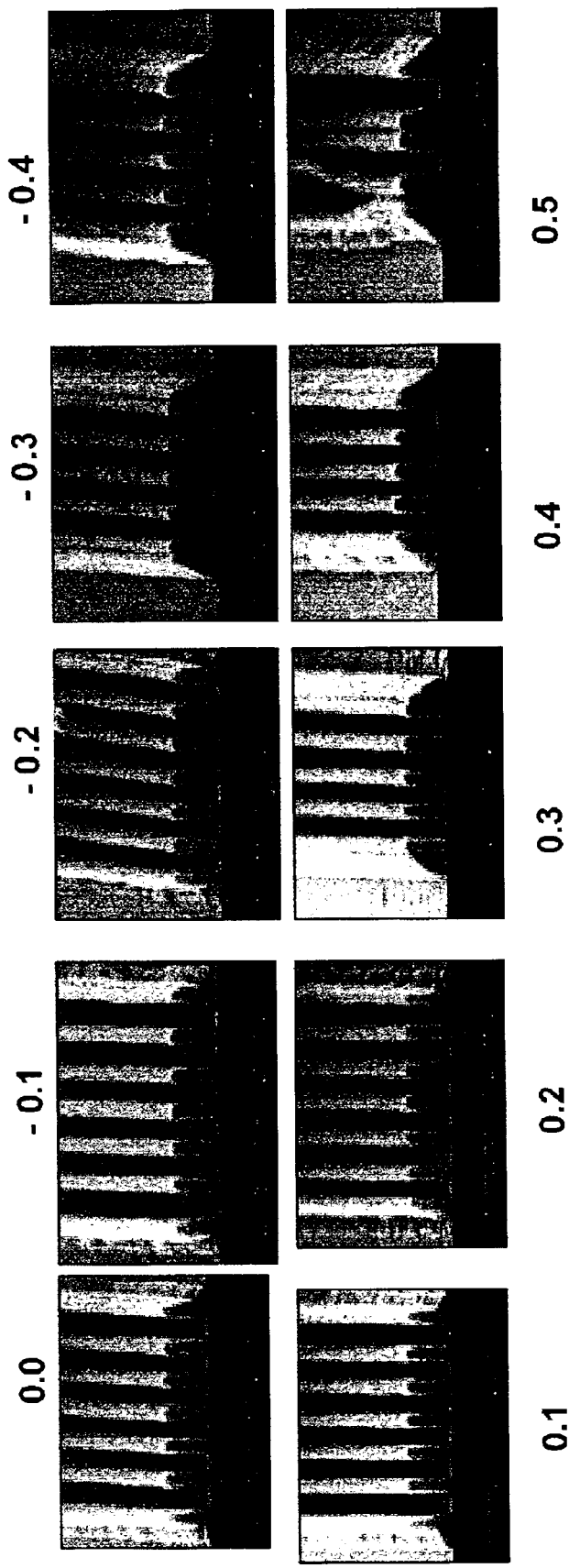
FIG. 4 depicts SEM photographs similar to those of FIGS. 2 and 3 except that a different commercially available photoresist was used.

This composition was applied to a wafer as described in Part 1 of this example, forming a cured film with a nominal thickness of 390 Å. The stripping test result was 3.5 Å while the interlayer test result was 13 Å. The SEM photographs from this sample are shown in FIGS. 2–4. FIG. 2 shows a sample (110 nm, 1:1.4 L/S) where AR237J (obtained from JSR Microelectronics) was used as the photoresist, and the following parameters were used: (1) Resist—Dispense: Automatic; SB: 130° C./90 sec.; Thickness 330 nm; Exposure Tool: ASML 5500/900; NA 0.63, Û 0.87/0.57; Annular illumination; Mask: TM99LF; E 16.5+0.5 mJ/cm$^2$; F 0.0+0.1; FEM E17×F17; PEB: 125° C./90 sec.; Develop.: OPD262-LD30 sec; and (2) Anti-Reflective Coating— Coating: 2700 rpm/60 sec.; Bake: 205° C./90 sec.; and Thickness: 388 Å.

FIG. 3 shows a sample (110 nm, 1:1 L/S) where TArF 6063 (obtained from TOK) was used as the photoresist, and the following parameters were used: (1) Resist—Dispense: Manual; SB: 130° C./90 sec.; Thickness 350 nm; Exposure Tool: ASML 5500/900; NA 0.63, Û 0.87/0.57; Annular illumination; Mask: TM99LF; E 13.0+0.3 mJ/cm$^2$; F 0.0+0.1; FEM E17×F17; PEB: 130° C./90 sec.; Develop.: OPD5262-LD60 sec.; and (2) Anti-Reflective Coating— Coating: 1500 rpm/60 sec.; Bake: 205° C./90 sec.; and Thickness: 387 Å.

FIG. 4 shows a sample (110 nm, 1:1 L/S) where PAR 718 (obtained from Sumitomo) was used as the photoresist, and the following parameters were used: (1) Resist—Dispense: Manual; SB: 130° C./60 sec.; Thickness 350 nm; Exposure Tool: ASML 5500/900; NA 0.63, σ 0.87/0.57; Annular illumination; Mask: TM99LF; E 25.0+0.3 mJ/cm$^2$; F 0.0+

0.1; FEM E17×F17; PEB: 1300C/60 sec.; Develop.: OPD262-LD60 sec.; and (2) Anti-Reflective Coating— Coating: 1500 rpm/60 sec.; Bake: 205° C./90 sec.; and Thickness: 388 Å.

Discussion

Each of the inventive anti-reflective coating compositions prepared in these examples exhibited excellent adhesion to the substrate as shown by the excellent coating quality on the substrate. Furthermore, it was concluded that the opening of the epoxy ring yielded a hydroxy functionality which reacted with the anhydride moiety on the chromophore to yield a thermoset crosslink. The presence of the thermoset crosslink was confirmed by the fact that the cured film showed very little thickness loss when exposed to polar solvents. The SEM photographs demonstrated excellent photoresist profiles obtained with this composition. This indicates that the composition has excellent anti-reflective properties needed to obtain good dimension control of the photoresist. It is believed that the hydroxy functionality from the polymer opened the anhydride ring on the chromophore to provide a —COOH functionality which assisted in trapping or neutralizing any amine-containing basic functionalities to which the photoresist may be exposed. This makes the inventive composition useful as a barrier material in either dual damascene or conventional lithographic processes. Finally, at thicknesses of only 300–400 Å, the cured compositions exhibited 0% reflectivity at 193 nm. Because this is an ultra-thin, anti-reflective coating composition, the photoresist loss during the etching of the anti-reflective coating is very minimal (i.e., the etch bias is minimal), thus allowing effective and efficient transfer of the photoresist pattern during the substrate etch so as to enable better lithographic performance.

I claim:

1. In an anti-reflective composition comprising a polymer dispersed in a solvent system, the improvement being that said polymer comprises recurring monomers according to the formula

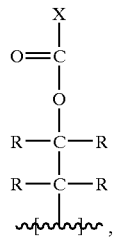

wherein:
each R is individually selected from the group consisting of —OH, —H, and alkyl groups; and
X is an aromatic or heterocyclic light-absorbing moiety and if none of R is —OH, then X includes an —OH.

2. The composition of claim 1, wherein X includes an aromatic portion selected from the group consisting of thiophenes, naphthoic acid, anthracene, naphthalene, benzene, chalcone, phthalimides, pamoic acid, acridine, azo compounds, dibenzofuran, and derivatives thereof.

3. The composition of claim 2, wherein X has a formula selected from the group consisting of

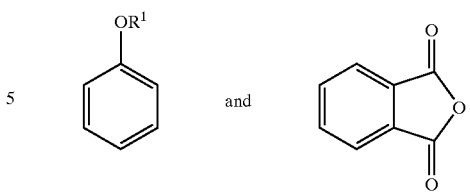

where $R^1$ is selected from the group consisting of —H and alkyl groups.

4. The composition of claim 1, wherein ~~~ is selected from the group consisting of acrylics, polyesters, epoxy novolacs, polysaccharides, polyethers, polyimides, and mixtures thereof.

5. The composition of claim 1, wherein said polymer has an average molecular weight of from about 3,000–60,000 Daltons.

6. The composition of claim 1, wherein X is present in said polymer at a level of from about 10–60% by weight, based upon the total weight of the polymer taken as 100% by weight.

7. The composition of claim 1, wherein said composition further comprises a compound selected from the group consisting of crosslinking agents, catalysts, and mixtures thereof.

8. The composition of claim 7, wherein said compound is a crosslinking agent selected from the group consisting of aminoplasts, epoxies, polyols, anhydrides, glycidyl ethers, vinyl ethers, and mixtures thereof.

9. The composition of claim 8, wherein said crosslinking agent is selected from the group consisting of glycourils, melamines, trimethylolpropane trivinylether, and trimethylolpropane triglycidylether.

10. The composition of claim 7, wherein said compound is a catalyst selected from the group consisting of p-toluenesulfonic acid, Bisphenol S, and mixtures thereof.

11. The composition of claim 1, wherein said solvent system includes a solvent selected from the group consisting of propylene glycol monomethyl ether, propylene glycol monomethyl ether acetate, ethyl lactate, cyclohexanone, and mixtures thereof.

12. A cured anti-reflective layer comprising a crosslinked polymer including recurring monomers having a formula

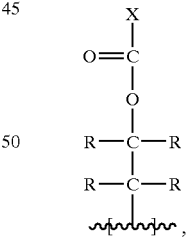

wherein:
each R is individually selected from the group consisting of —OH, —H, and alkyl groups;
X is an aromatic or heterocyclic light-absorbing moiety; and
at least one of X or R is, or comprises, an —OR² group, where R² is a crosslinking group.

13. The layer of claim 12, wherein X includes an aromatic portion selected from the group consisting of thiophenes, naphthoic acid, anthracene, naphthalene, benzene, chalcone, phthalimides, pamoic acid, acridine, azo compounds, dibenzofuran, and derivatives thereof.

14. The layer of claim 13, wherein X has a formula selected from the group consisting of

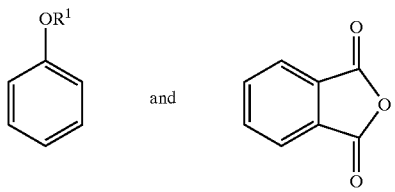

and where $R^1$ is selected from the group consisting of —H and alkyl groups.

15. The layer of claim 12, wherein ⌇ is selected from the group consisting of acrylics, polyesters, epoxy novolacs, polysaccharides, polyethers, polyimides, and mixtures thereof.

16. The layer of claim 12, wherein said polymer has an average molecular weight of from about 3,000–60,000 Daltons.

17. The layer of claim 12, wherein X is present in said polymer at a level of from about 10–60% by weight, based upon the total weight of the polymer taken as 100% by weight.

18. The layer of claim 12, wherein said layer is adjacent a substrate.

19. The layer of claim 18, wherein said substrate is selected from the group consisting of Si, Al, W, WSi, GaAs, SiGe, Ta, and TaN wafers.

20. The layer of claim 18, wherein $R^2$ is selected from the group consisting of moieties of glycourils, melamines, trimethylolpropane trivinylether, and trimethylolpropane triglycidylether.

21. A method of using an anti-reflective composition, said method comprising the step of applying a quantity of the composition according to claim 1 to a substrate to form a layer thereon.

22. The method of claim 21, wherein said applying step comprises spin-coating said composition onto said substrate surface.

23. The method of claim 21, wherein said substrate has a hole formed therein, said hole being defined by a bottom wall and sidewalls, and said applying step comprises applying said composition to at least a portion of said bottom wall and sidewalls.

24. The method of claim 21, further including the step of baking said layer, after said applying step, at a temperature of from about 115–205° C. to yield a cured layer.

25. The method of claim 24, further including the step of applying a photoresist to said baked layer.

26. The method of claim 25, furthering including the steps of:
    exposing at least a portion of said photoresist to activating radiation;
    developing said exposed photoresist; and
    etching said developed photoresist.

27. The method of claim 21, wherein X includes an aromatic portion selected from the group consisting of thiophenes, naphthoic acid, anthracene, naphthalene, benzene, chalcone, phthalimides, pamoic acid, acridine, azo compounds, dibenzofuran, and derivatives thereof.

28. The method of claim 27, wherein X has a formula selected from the group consisting of

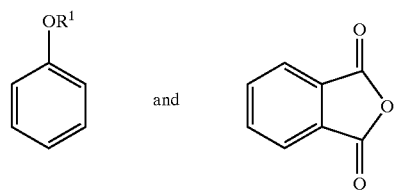

and where $R^1$ is selected from the group consisting of —H and alkyl groups.

29. The method of claim 22, wherein ⌇ is selected from the group consisting of acrylics, polyesters, epoxy novolacs, polysaccharides, polyethers, polyimides, and mixtures thereof.

30. The method of claim 21, wherein X is present in said polymer at a level of from about 10–60% by weight, based upon the total weight of the polymer taken as 100% by weight.

31. The combination of:
    a substrate having a surface;
    a cured anti-reflective layer adjacent said substrate surface, said anti-reflective layer being formed from a composition comprising a polymer and trimethylolpropane trivinylether dispersed in a solvent system; and
    a photoresist layer adjacent said anti-reflective coating composition layer.

32. A method of forming a final polymer, said method comprising the step of reacting a starting polymer with a chromophore, wherein:
    said starting polymer includes recurring monomers comprising epoxide rings;
    said chromophore is selected from the group consisting of trimellitic anhydride and 4-hydroxybenzoic acid; and
    during said reacting step, said epoxide ring opens and said chromophore bonds with the opened ring.

* * * * *

UNITED STATES PATENT AND TRADEMARK OFFICE
CERTIFICATE OF CORRECTION

PATENT NO. : 6,846,612 B2
DATED : January 25, 2005
INVENTOR(S) : Deshpande

It is certified that error appears in the above-identified patent and that said Letters Patent is hereby corrected as shown below:

<u>Column 1,</u>
Line 7, insert:
-- FEDERALLY SPONSORED RESEARCH/DEVELOPMENT PROGRAM
   This invention was made with Government support under contract DASG60-01-C-0047 awarded by the United States Army Space and Missile Defense Command. The Government has certain rights in the invention. --.

Signed and Sealed this

Eighteenth Day of April, 2006

JON W. DUDAS
*Director of the United States Patent and Trademark Office*